(12) United States Patent
Mercier et al.

(10) Patent No.: US 9,585,255 B2
(45) Date of Patent: Feb. 28, 2017

(54) COMPONENT SUPPORT FOR DENSE CIRCUIT BOARD

(71) Applicant: Raytheon Company, Waltham, MA (US)

(72) Inventors: Dennis W. Mercier, Hudson, MA (US); Corey R. Delisle, Fitchburg, MA (US); Patrick J. Lott, Lowell, MA (US); Dimitry Zarkh, Waltham, MA (US)

(73) Assignee: RAYTHEON COMPANY, Waltham, MA (US)

( * ) Notice: Subject to any disclaimer, the term of this patent is extended or adjusted under 35 U.S.C. 154(b) by 161 days.

(21) Appl. No.: 14/644,721

(22) Filed: Mar. 11, 2015

(65) Prior Publication Data

US 2016/0270230 A1    Sep. 15, 2016

(51) Int. Cl.
*H05K 1/18* (2006.01)
*H01G 2/06* (2006.01)
(Continued)

(52) U.S. Cl.
CPC ............ *H05K 1/184* (2013.01); *F16M 13/02* (2013.01); *H01G 2/06* (2013.01); *H05K 1/11* (2013.01); *H05K 1/115* (2013.01); *H05K 1/181* (2013.01); *H05K 3/306* (2013.01); *H05K 3/3447* (2013.01); *H05K 2201/10015* (2013.01); *H05K 2201/10431* (2013.01); *H05K 2201/10606* (2013.01)

(58) Field of Classification Search
CPC ............ H01R 12/7076; H01R 12/7082; H01R 23/6806; H01R 23/6813; H01R 23/682; H01R 23/6826; H01R 23/684; H01R 9/097; H01R 9/092; H01R 9/091; H01R 9/098; H05K 1/184; H05K 7/10; H05K 7/12; H05K 2201/10295; H05K 1/0203
See application file for complete search history.

(56) References Cited

U.S. PATENT DOCUMENTS 2,762,597 A    9/1956    Jaworski
2,962,638 A    11/1960   Nieders
(Continued)

FOREIGN PATENT DOCUMENTS

DE    102008049357 A1    4/2009
EP    2169695 A1         3/2010

OTHER PUBLICATIONS

International Search Report issue in PCT/US2016/021904, Jun. 27, 2016; 6 pages.
(Continued)

*Primary Examiner* — Jeremy C Norris
(74) *Attorney, Agent, or Firm* — Cantor Colburn LLP (57) ABSTRACT

A support apparatus for a component is provided and includes a periphery entirely disposable within a footprint of the component on a surface of a substrate, a first portion having a first surface adhesively connectable to the component, a second portion having a second surface disposable to contact the surface of the substrate in discrete sectors and defining an aperture through which leads are extendable from the component and through the substrate, and vents extending between the discrete sectors from the aperture to the periphery, and bosses disposed to protrude from the second surface and into through-holes defined in the substrate.

20 Claims, 5 Drawing Sheets

(51) Int. Cl.
    *H05K 3/30*         (2006.01)
    *H05K 3/34*         (2006.01)
    *F16M 13/02*       (2006.01)
    *H05K 1/11*         (2006.01)

(56) References Cited

U.S. PATENT DOCUMENTS

| | | |
|---|---|---|
| 3,237,905 A | 3/1966 | Baker |
| 4,339,105 A | 7/1982 | Witt |
| 4,575,038 A | 3/1986 | Moore |
| 5,199,887 A * | 4/1993 | Iacono ................ H01R 9/0515 |
| | | 439/581 |
| 5,287,076 A | 2/1994 | Johnescu |
| 6,783,376 B2 | 8/2004 | Will et al. |
| 6,933,805 B1 | 8/2005 | Norte |
| 7,559,511 B2 | 7/2009 | Yon |
| 7,685,703 B1 | 3/2010 | Devoe |
| D712,355 S | 9/2014 | Nakamura |
| 8,837,166 B2 | 9/2014 | Massolle |
| 8,944,827 B2 * | 2/2015 | Ohsaka ................ H01R 12/57 |
| | | 439/581 |
| 2004/0140414 A1 | 7/2004 | Chen |
| 2012/0077356 A1 | 3/2012 | Shimizu et al. |
| 2012/0119055 A1 | 5/2012 | Mimura |
| 2013/0140079 A1 | 6/2013 | Nakamura |
| 2014/0133122 A1 | 5/2014 | Hoffmeyer |

OTHER PUBLICATIONS

Written Opinion issue in PCT/US2016/021904, Jun. 27, 2016; 5 pages.

* cited by examiner

COMPONENT SUPPORT FOR DENSE CIRCUIT BOARD

BACKGROUND

The present invention relates to a component support, and, more specifically, to a component or capacitor support for a densely populated circuit board.

Recent trends in antenna array configurations point toward the use of increasingly complex circuit boards that are tightly packed with densely populated components. At the same time, the trends indicate that the real estate made available for strain relief of the components (i.e., capacitors) with off the shelf clamps will be reduced. Thus, current circuit board design programs presently have and will continue to have a need for compact capacitor support that efficiently uses available circuit board space to provide for strain relief.

Typically, capacitor support is provided by vertical mounting brackets. These clamps are adjustable to multiple sizes of capacitors, are extremely cheap and can be repeatedly deployed when adequate space is allocated to accommodate them. However, as noted above, circuit board densities are becoming critical and there is rarely additional space available for the wide flange on these clamps. Other options include clamps that are often used in automotive applications. These clamps are also relatively inexpensive and repeatedly deployable by press-fittings into their circuit boards so as to not require any additional solder operations. The right angle design of these clamps uses considerable real estate, however, and therefore they are not ideal for applications where dense packaging is necessary. Yet another option includes bonding of capacitors to circuit boards directly but the adhesives that can be used are limited and rework is challenging.

SUMMARY

According to one embodiment of the present invention, a support apparatus for a component is provided and includes a periphery entirely disposable within a footprint of the component on a surface of a substrate, a first portion having a first surface adhesively connectable to the component, a second portion having a second surface disposable to contact the surface of the substrate in discrete sectors and defining an aperture through which leads are extendable from the component and through the substrate, and vents extending between the discrete sectors from the aperture to the periphery, and bosses disposed to protrude from the second surface and into through-holes defined in the substrate.

According to another embodiment of the present invention, a circuit board assembly is provided and includes a substrate having first and second opposite substrate surfaces in which a circuit is disposed, a component, which is electrically connectable to the circuit and a support apparatus configured to support the component on the substrate. The support apparatus includes a periphery entirely disposable within a footprint of the component on the first substrate surface, a first portion having a first support surface adhesively connectable to the component, a second portion having a second support surface disposable to contact the first substrate surface in discrete sectors and defining an aperture through which leads are extendable from the component and through the substrate, and vents extending between the discrete sectors from the aperture to the periphery, bosses disposed to protrude from the second support surface and into through-holes defined in the substrate and fastening elements disposable to fasten the bosses to the substrate at the through-holes.

According to another embodiment of the present invention, a circuit board assembly is provided and includes a substrate having first and second opposite substrate surfaces in which a circuit is disposed, an array of components, each of which is electrically connectable to the circuit via component leads, and an array of support apparatuses respectively supporting corresponding ones of the components on the substrate. Each support apparatus is encompassed within a footprint of the component, adhered to the component, coupled to the substrate in multiple locations and configured to permit fluid flow about the component leads.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As will be described below, a support apparatus for supporting a circuit board component on a circuit board is provided. The support apparatus has a compact design that allows for optimal packaging density on the circuit board, a self-aligning capability, is scalable for smaller and larger capacitors and allows for capacitors to be easily replaced and/or reworked. In addition, the support apparatus is structurally robust with multi-directional load stability and high shock and vibration resistance, and fully retains the capacitor with inherent fatigue resistance during normal operations as well as soldering operations. Furthermore, the support apparatus can be CTE (coefficient of thermal expansion) matched with the capacitor and has built-in channels to prevent cleaning fluid entrapment, as well as a center hole that allows for capacitor venting.

Figure 1:
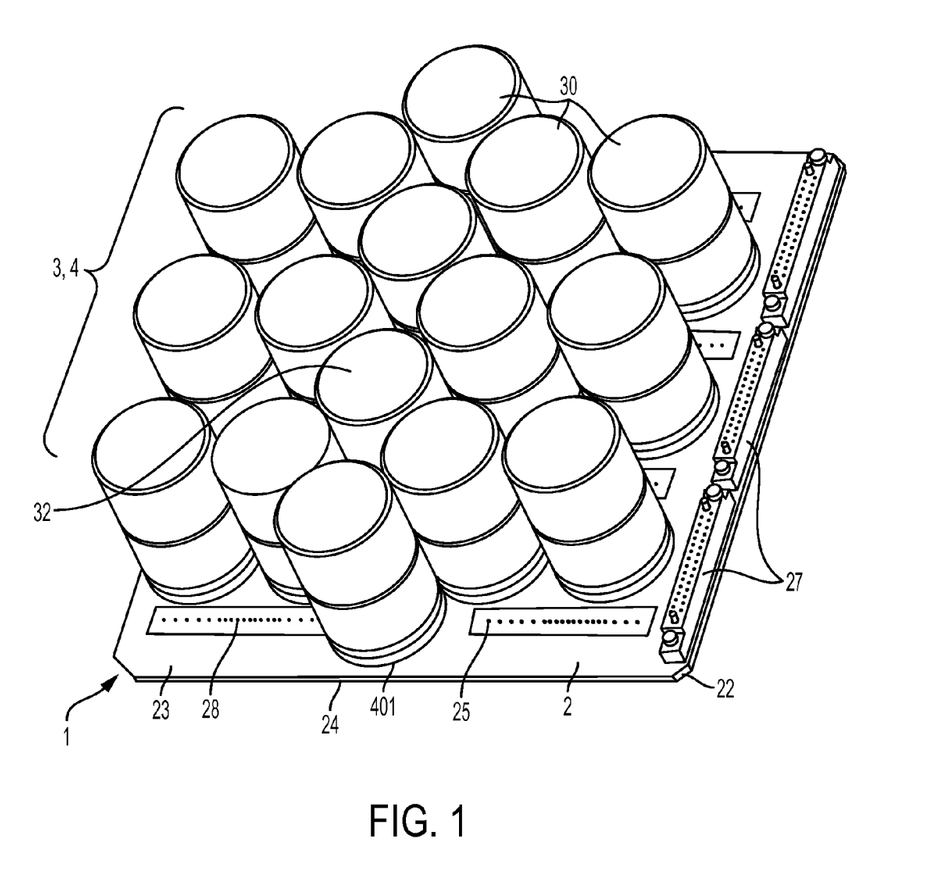
FIG. 1 is a perspective view of a circuit board assembly in accordance with embodiments.
Figure 2:
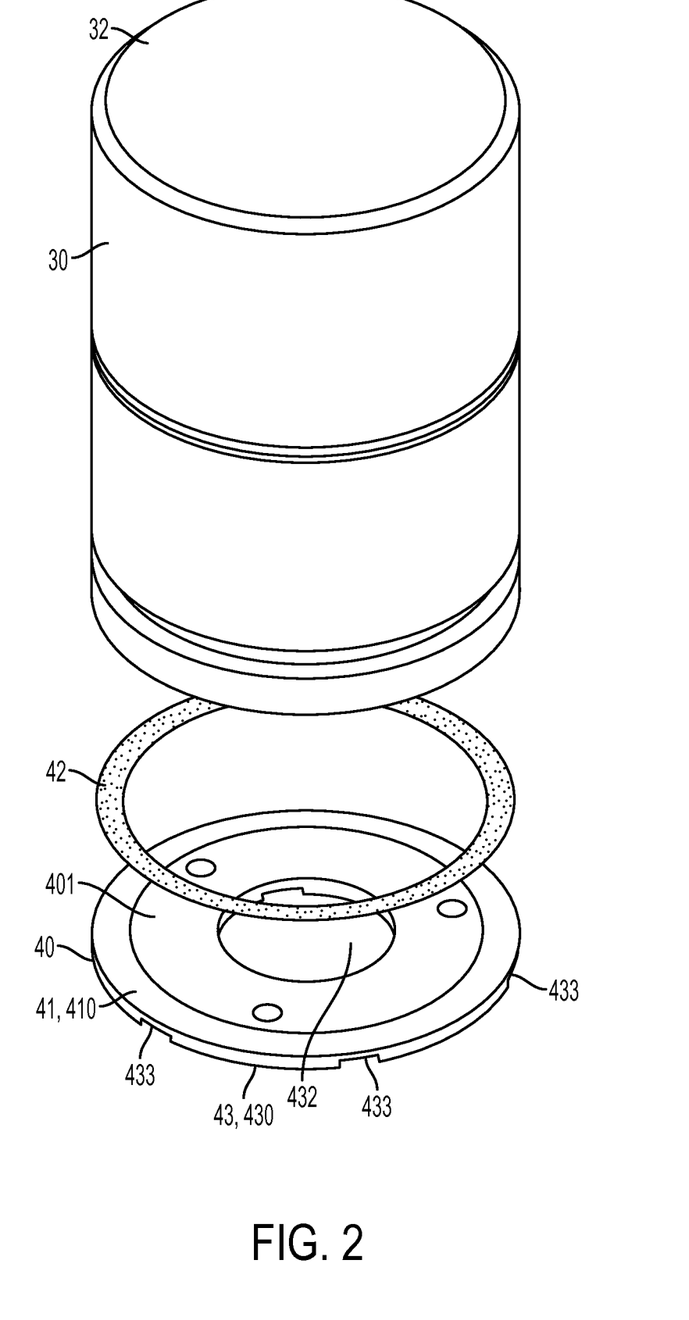
FIG. 2 is an exploded perspective view of a cell of the circuit board assembly of FIG. 1.

With reference now to FIGS. 1 and 2, a circuit board assembly 1 is provided and includes a substrate 2, a first array of electrical components 3, a second array of support apparatuses 4 and fastening elements 5 (see FIGS. 4 and 5) to be discussed below. The substrate 2 may be provided as a circuit board 20 that has a substrate body 22 with a substantially planar, first substrate surface 23 facing in one direction and a substantially planar, second substrate surface 24 facing in an opposite direction. At least one or more circuits 25 are disposed in or on the substrate body 22.

The first array of the electrical components 3 may be provided in a matrix of various possible configurations (e.g., the combination of the 4×3 matrix with the center-line 1×4 matrix illustrated in FIG. 1) with each of the electrical components 3 being electrically connectable to the at least one or more circuits 25 via component leads 26 (see FIGS. 3A, 3B, 4 and 5). The second array of the support apparatuses 4 is disposed in a similar formation as the first array of the electrical components 3 such that each of the support apparatuses 4 is disposed to respectively support a corresponding one of the electrical components 3 on the substrate 2.

In accordance with embodiments, the circuit board assembly 1 may be provided for use in an antenna array or some other similar device. As such, the electrical components 3 may include at least a plurality of capacitors 30 that are respectively disposed to be coupled to the at least one or more circuits 25 via the component leads 26. In addition, other components of the circuit board assembly 2 may include connector modules 27, which are coupled directly to the substrate 2, additional connector locations 28 and back- or front-side electrical or structural modules (not shown) that can be connected to the substrate 2 by way of connector holes 28 defined by the substrate body 22.

Where the electrical components 3 are provided as capacitors 30, for example, the first and second arrays may be densely packed and populated such that little to no room is available between the capacitors 30 or between the capacitors 30 and the connector modules 27 or the additional connector locations 28. In such cases, the capacitors 30 may have substantially cylindrical shapes 31 with a circular footprint 32 that is projected onto the first substrate surface 23. Meanwhile, each support apparatus 4 has a footprint that is encompassed within the circular footprint 32 of its capacitor 30, each support apparatus 4 is adhered to its capacitor 30 and coupled to the substrate body 22 in multiple locations as will be described below and each support apparatus 4 is configured to permit fluid flow about the component leads 26 of its capacitor 30.

For purposes of clarity and brevity, the following description will relate to the case where the electrical components 3 are capacitors 30 as shown in FIGS. 1 and 2. However, it is to be understood that this not to be construed in any limiting sense, and that other embodiments are possible and within the scope of the present invention.

With continued reference to FIG. 2 and with additional reference to FIGS. 3A, 3B, 4 and 5, each support apparatus 4 includes a peripheral body 40, a first portion 41 (see FIG. 4), adhesive 42, a second portion 43 (see FIG. 4) and bosses 44. In accordance with embodiments, each support apparatus 4 may be formed of various materials, such as metals, metallic alloys and composites. In accordance with further embodiments, each support apparatus 4 may be formed of aluminum or aluminum alloys and, in accordance with still further embodiments, each support apparatus 4 may be formed of materials that are CTE matched (i.e., have similar coefficients of thermal expansion) to the capacitors 30. In accordance with alternative embodiments, however, each support apparatus 4 may be formed of materials that are CTE mismatched with respect to the capacitors 30 with CTE compliance achieved by the adhesive 42, which is interposed between the peripheral body 40 and the first portion 41 and the capacitor 30 for each support apparatus 4.

Figure 3A:
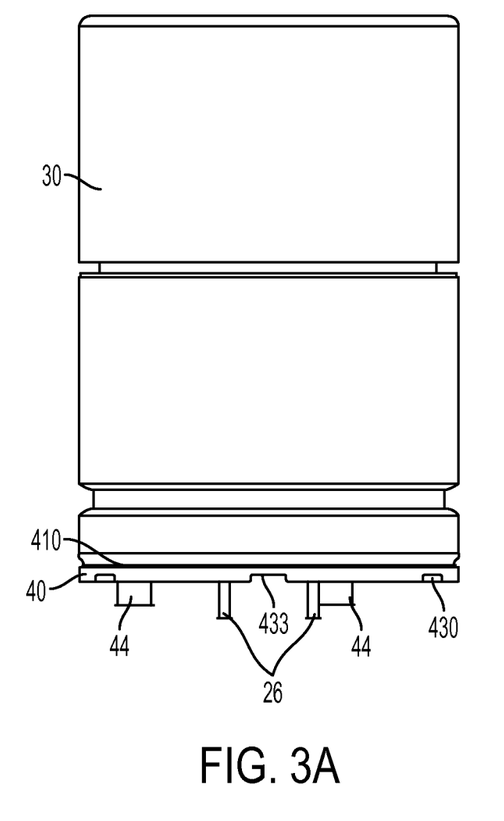
FIG. 3A is a side view of a portion of the cell of FIG. 2.

The peripheral body 40 may have a substantially circular footprint 401 that is entirely disposable within the circular footprint 32 of the capacitor 30 on the first substrate surface 23 although it is to be understood that this is not required and that the peripheral body 40 can have any shape or footprint shape as long as it is encompassed within the footprint of its capacitor 30 (or, more generally, its electrical component 3) as shown particularly in FIG. 3A. The first portion 41 may be provided as an upper portion of the peripheral body 40 and has a first or upper support surface 410. This first support surface 410 is adhesively connectable to a complementary or lower surface of the capacitor 30 via the adhesive 42. The adhesive 42 may be provided as a ring-shaped element between the capacitor 30 and the first support surface 410.

As noted above, at least the first support surface 410 may be formed of materials that are CTE matched to those of the capacitor 30. Alternatively, the first support surface 410 may be formed of materials that are CTE mismatch with respect to those of the capacitor 30 with the adhesive 42 providing CTE compliance capability.

Figure 3B:
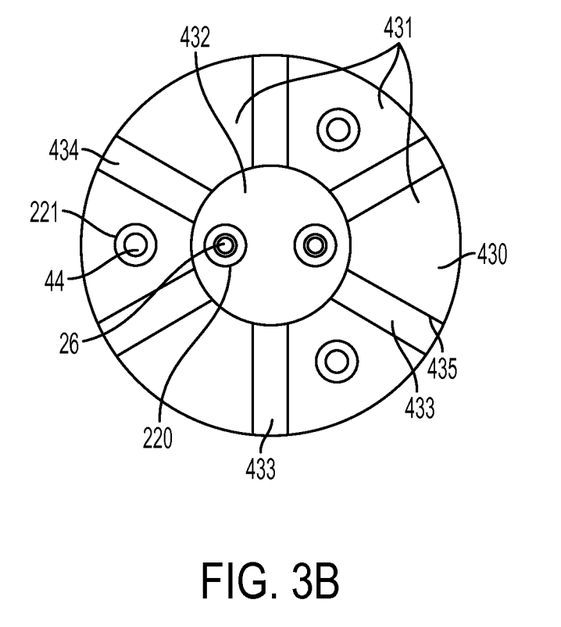
FIG. 3B is an axial view of the cell of FIG. 2.

The second portion 43 may be provided as a lower portion of the peripheral body 40 and has a second or lower support surface 430. The second support surface 430 is disposable to contact the first substrate surface 23 in discrete sectors 431, as shown in FIG. 3B. The second portion 43 is further formed to define an aperture 432 and vents 433. The aperture 432 may be disposed in a central region of the support apparatus 4 and provides for a space through which the component leads 26 of the capacitor 30 are extendable from the capacitor 30 and through the substrate body 22 to, in some cases, beyond a plane of the second substrate surface 34. The vents 433 extend between the discrete sectors 431 from the aperture 432 to the peripheral body 40.

In accordance with embodiments, the discrete sectors 431 may be provided as six uniformly shaped discrete sectors 431, with the aperture 432 provided as a circular aperture 432 in a central region and the vents 433 provided as six uniformly shaped and arrayed vents 433 extending radially outwardly from the aperture 432 between the six uniform discrete sectors 431. That is, each individual vent 433 extends radially outwardly from the aperture 432 between two adjacent discrete sectors 431 with each individual vent 433 separated from two adjacent vents 433 by about 60 degrees.

In any case, as shown in FIG. 3B, at least at the vents 433, the second portion 43 includes third surfaces 434 and fourth surfaces 435. The third surfaces 434 are oriented substantially parallel to and recessed from a plane of the second support surface 430 and the fourth surfaces 435 are oriented transversely with respect to the first support surface 410, the second support surface 430 and the third surfaces 434. That is, the third surfaces 434 form the axial surfaces of the vents 433 while the fourth surfaces form the sidewalls of the vents 433. In accordance with embodiments, the fourth surfaces 435 may be perpendicular with respect to the first support surface 410, the second support surface 430 and the third surfaces 434.

The substrate body 22 is formed to define multiple lead holes 220 and multiple through-holes 221. The lead holes 220 extend through the substrate body 22 from the first support surface 23 to the second support surface 24 and permit the component leads 26 to extend from the capacitor 30 to beyond the plane of the second support surface 24. The lead holes 220 are formed to be larger than the component leads 26 and are fluidly communicative with the space inside the aperture 432 and the vents 433. The through-holes 221 are disposed about the lead holes 220 within the circular footprint 32 of the capacitor 30 and extend through the substrate body 22 from the first support surface 23 to the second support surface 24.

The bosses 44 are disposed to protrude from the plane of the second support surface 430 in some, but not necessarily all of the discrete sectors 431 and into through-holes 221. Within the through-holes 221, the bosses 44 are engageable with the fastening elements 5 to secure the support apparatus 4 to the substrate body 22. In accordance with embodiments, where six discrete sectors 431 are formed, the bosses 44 and the through-holes 221 may be provided as three bosses 44 and three through-holes 221, respectively. In such cases, pairs of an individual boss 44 and its corresponding individual through-holes 221 can be disposed to correspond in position to every other one of the six discrete sectors 431 and may be separated from one another by about 120 degrees. Thus, with the three bosses 44 secured within the three through-holes 221, the support apparatus 4 can be securely coupled to the substrate body 22 in three locations. In this way, the support apparatus 4 is radially placed and oriented in its given location on the substrate body 22 and supported in multiple directions to be structurally robust with multi-directional load stability and high shock and vibration resistance.

While the embodiment in which three pairs of bosses 44 and fastening elements 5 are engaged and secured within three through-holes 221, it is to be understood that this is merely exemplary and that greater or lesser numbers of bosses 44, fastening elements 5 and through-holes 221 can be used. Moreover, while the number of bosses 44 cannot exceed the number of through-holes 221, it is to be understood that the number of through-holes 221 can exceed the number of bosses 44.

Figure 4:
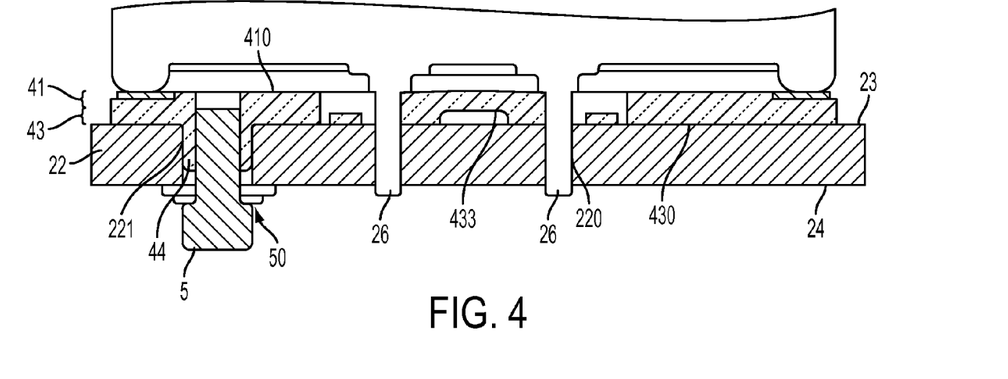
FIG. 4 is an enlarged side view of a support apparatus for the circuit board assembly of FIG. 1 in accordance with embodiments.
Figure 5:
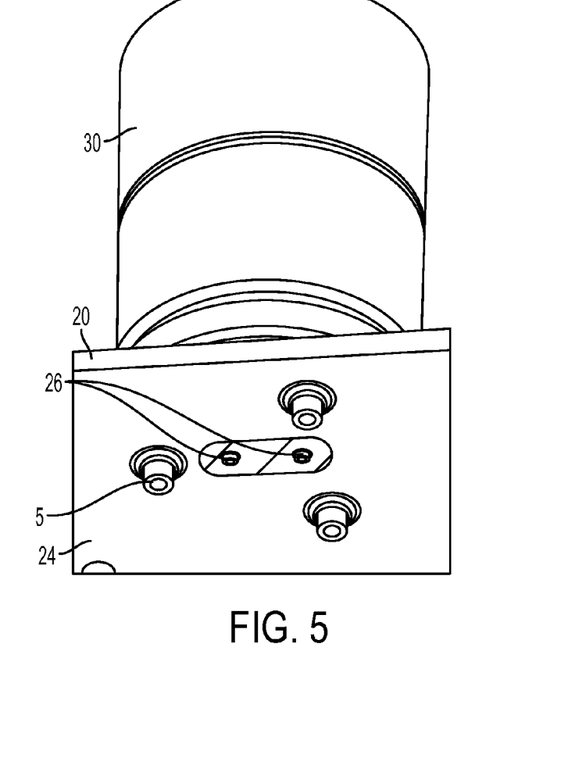
FIG. 5 is a perspective view of fastening elements of the circuit board assembly of FIG. 1 in accordance with embodiments.

In accordance with further embodiments and, as shown in FIG. 4, the bosses 44 may be configured to extend at least partially through the through-holes 221.
However, it is to be understood that this is merely exemplary and that other options are available for the lengths of the bosses 44. That is, the bosses 44 may extend beyond the plane of the second support surface 430. In any case, the bosses may include interior threading and thus may be threadably engageable with the fastening elements 5, which may be provided as screw-washer combinations 50 with complementary exterior threading.

In accordance with alternative embodiments, the second portion 43 may be formed to define screw-holes into which the fastening elements 5 are extendible. In addition, the fastening elements 5 may be formed so as to be flush or nearly flush with the plane of the second support surface 24.

In any case, once the fastening elements 5 are securably engaged with the bosses 44, the fastening elements 5 take all or at least a majority of the loads off of the component leads 26. The fastening elements 5 can thus serve to maintain, insure and protect the reliability of the electrical couplings between the component leads 26 and the at least one or more circuits 25.

During an assembly process for the circuit board assembly 1 described above, an initial assembly stage may involve the disposition of the adhesive 42 on the peripheral body 40 and the subsequent adhering of the capacitor 30 to the peripheral body 40. During this stage, the component leads 26 of the capacitor 30 each pass into and ultimately extend through the aperture 432. Once the adhesive 42 cures (i.e., by heat or ultraviolet (UV) curing), the support apparatus 4 can be disposed onto the first support surface 23 of the substrate body 22 with the component leads 26 extending through the lead holes 220 and the bosses 44 extending at least partially through the through-holes 221. At this point, the fastening elements 5 can be used to secure the bosses 44 within the through-holes 221 to thus securely couple the support apparatus 4 and the capacitor 30 to the substrate body 22. The, during late assembly stages, solder reflow can be performed to electrically couple the capacitor 30 to the at least one or more circuits 25.

With the aperture 432 and the vents 433 fluidly communicative with the lead holes 220, air flow directed away from the lead holes 220 that results from the solder reflow processing is permitted and thus allows for the solder reflow processing to proceed efficiently and to form reliable circuit connections.

In accordance with further embodiments, it will be understood that the solder reflow processing is merely exemplary and that other processing operations (e.g., hand soldering, selective soldering, wave soldering, etc.) can be used to electrically couple the component leads 26 to the at least one or more circuits 25. Moreover, it will be understood that the processing operations can be executed with respect to component leads 26 of an individual capacitor 30 at a time or with respect to component leads 26 of multiple capacitors 30 simultaneously.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A support apparatus for a component, the support apparatus comprising:
 a periphery entirely disposable within a footprint of the component on a surface of a substrate;
 a first portion having a first surface adhesively connectable to the component;
 a second portion having a second surface disposable to contact the surface of the substrate in discrete sectors and defining:

an aperture through which leads are extendable from the component and through the substrate, and vents extending between the discrete sectors from the aperture to the periphery; and bosses disposed to protrude from the second surface and into through-holes defined in the substrate.

2. The support apparatus according to claim 1, wherein the first and second surfaces face in opposite directions.

3. The support apparatus according to claim 1, wherein the discrete sectors are provided as six uniform discrete sectors.

4. The support apparatus according to claim 3, wherein the aperture has a substantially circular shape.

5. The support apparatus according to claim 3, wherein the vents are provided as six uniform vents extending radially outwardly between the six uniform discrete sectors.

6. The support apparatus according to claim 5, wherein the second portion comprises at the vents:

third surfaces parallel to and recessed from a plane of the second surface; and fourth surfaces oriented transversely with respect to the first, second and third surfaces.

7. The support apparatus according to claim 1, wherein the bosses are provided as three bosses arrayed around the aperture.

8. The support apparatus according to claim 1, wherein the bosses comprise interior threading.

9. A circuit board assembly, comprising:

a substrate having first and second opposite substrate surfaces in which a circuit is disposed;

a component, which is electrically connectable to the circuit; and a support apparatus configured to support the component on the substrate and comprising:

a periphery entirely disposable within a footprint of the component on the first substrate surface;

a first portion having a first support surface adhesively connectable to the component;

a second portion having a second support surface disposable to contact the first substrate surface in discrete sectors and defining:

an aperture through which leads are extendable from the component and through the substrate, and vents extending between the discrete sectors from the aperture to the periphery;

bosses disposed to protrude from the second support surface and into through-holes defined in the substrate; and fastening elements disposable to fasten the bosses to the substrate at the through-holes.

10. The circuit board assembly according to claim 9, wherein the support apparatus comprises metallic material.

11. The circuit board assembly according to claim 9, wherein the component comprises a capacitor having a substantially cylindrical shape and the periphery has a substantially circular shape.

12. The circuit board assembly according to claim 9, further comprising adhesive interposed between the periphery and the component.

13. The circuit board assembly according to claim 9, wherein the first and second support surfaces face in opposite directions.

14. The circuit board assembly according to claim 9, wherein the substrate defines lead holes through which the leads extend, the lead holes being fluidly communicative with the aperture and the vents.

15. The circuit board assembly according to claim 9, wherein the bosses extend at least partially through the through-holes.

16. The circuit board assembly according to claim 9, wherein the bosses are threadably engageable with the fastening elements.

17. The circuit board assembly according to claim 9, wherein the fastening elements comprise screw-washer combinations.

18. A circuit board assembly, comprising:

a substrate having first and second opposite substrate surfaces in which a circuit is disposed;

an array of components, each of which is electrically connectable to the circuit via component leads; and an array of support apparatuses respectively supporting corresponding ones of the components on the substrate, each support apparatus being encompassed within a footprint of the component, adhered to the component, coupled to the substrate in multiple locations and configured to permit fluid flow about the component leads.

19. The circuit board assembly according to claim 18, wherein at least one or more of the components comprises a capacitor.

20. The circuit board assembly according to claim 18, wherein the arrays are densely packed.

* * * * *